United States Patent
Chou

(10) Patent No.: US 8,081,530 B2
(45) Date of Patent: Dec. 20, 2011

(54) SEMICONDUCTOR MEMORY DEVICE AND ASSOCIATED LOCAL SENSE AMPLIFIER

(75) Inventor: Min Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 185 days.

(21) Appl. No.: 12/713,639

(22) Filed: Feb. 26, 2010

(65) Prior Publication Data

US 2011/0211407 A1    Sep. 1, 2011

(51) Int. Cl.
*G11C 7/02* (2006.01)

(52) U.S. Cl. .................. 365/207; 365/203; 365/205

(58) Field of Classification Search .............. 365/205, 365/207, 203
See application file for complete search history.

(56) References Cited

U.S. PATENT DOCUMENTS

| | | | |
|---|---|---|---|
| 6,075,728 A * | 6/2000 | Inoue et al. | 365/189.2 |
| 6,212,109 B1 * | 4/2001 | Proebsting | 365/189.16 |
| 7,002,858 B2 | 2/2006 | Lee | |
| 7,417,911 B2 * | 8/2008 | Kuroda | 365/203 |
| 2001/0019512 A1 * | 9/2001 | Hidaka | 365/230.03 |
| 2006/0023555 A1 * | 2/2006 | Morishima | 365/230.03 |
| 2009/0086550 A1 | 4/2009 | Kwak | |

* cited by examiner

*Primary Examiner* — Tuan T. Nguyen
(74) *Attorney, Agent, or Firm* — WPAT, P.C.; Anthony King

(57) ABSTRACT

A semiconductor memory device comprises a plurality of memory cells, a bit line sense amplifier, a local sense amplifier, and a sense amplifier. The memory cells are connected between a word line and a bit line pair, and the bit line sense amplifier is configured to amplify voltages of data from the bit line pair and then transmits the data to a local data line pair. The local sense amplifier is configured to amplify voltages of the data from the local data line pair and transmit the data to a global data line pair in response to first and second control signals, and the sense amplifier is configured to amplify the voltages of the data from the global data line pair and transmit the data to an input/output line pair during a read operation. The local sense amplifier comprises a first read circuit, a second read circuit, and a write circuit, and when the memory device performs the read operation, the data is transmitted from the first read circuit to the write circuit via the second read circuit.

19 Claims, 5 Drawing Sheets

26

28

SEMICONDUCTOR MEMORY DEVICE AND ASSOCIATED LOCAL SENSE AMPLIFIER

BACKGROUND OF THE INVENTION

1. Field of the Invention

The present invention relates to a semiconductor memory device, and more particularly to a local sense amplifier in a semiconductor memory device.

2. Description of the Related Art

Semiconductor memory devices are devices in which data can be stored and from which the stored data can be retrieved. Semiconductor memory devices can be classified into random access memory (RAM) and read only memory (ROM). RAM is a volatile memory that needs power supply to retain data. ROM is a nonvolatile memory that can retain data even when power is removed. Examples of RAM are a dynamic RAM (DRAM) and a static RAM (SRAM). Examples of ROM are a programmable ROM (PROM), an erasable PROM (EPROM), an electrically erasable PROM (EEPROM), and a flash memory.

A semiconductor memory device comprises a cell array with a plurality of memory cells. Each of the memory cells is connected to a wordline and a bitline. By asserting the appropriate wordline and bitline, the data stored in a memory cell can be read and the data can also be written into the memory cell. When the memory device performs a read operation, the data stored in the memory cell is transmitted to the associated bit line. Next, a sense amplifier amplifies the data and transmits the data outside the memory device. Typically, the data transmission path includes a bit line pair BL and BLN, a local data line pair LDL, LDLN, a global data line pair GDL and GION, and an input/output line pair IO and ION.

With the increase in the number of memory cells, the physical area of the memory device increases, and so does the physical length of the data transmission path. For transmitting data stored in the memory cell quickly and completely, the sense amplifier should have enough driving ability. However, the driving ability of the sense amplifier is determined by the impedance of the data transmission path including an inherent line resistance, an inherent line capacitance and the capacitance of the pass transistors connected between the sense amplifier and the data path. Therefore, with the increase of the data transmission path, the sense amplifier is unable to maintain the high operating frequency of the memory device, and thus additional driving circuits are required to improve the transmission speed of the data.

U.S. Pat. No. 7,002,858 provides a semiconductor memory device in which a local input/output line sense amplifier can be selectively enabled or disabled. The semiconductor memory device comprises a redundancy circuit, a switch unit, and a control unit. If the redundancy circuit operates, the control unit generates a sense amplifier operation control signal that disables the local input/output line sense amplifier. The above memory device requires additional circuits and area to implement the redundancy circuit. U.S. Patent Publication No. 20090086550 provides a semiconductor memory device including a plurality of banks stacked in a column direction, a global data line and a common global data line driving unit. The above patent provides the semiconductor memory device that can minimize circuit dimensions for a data bus driving circuit in a stacked bank structure. However, it lacks a local sense amplifier and thus the operating frequency of the memory device may be limited.

Therefore, in order to increase the driving ability of the memory device, it is desirable to provide a memory device having a local sense amplifier implemented in a small layout area.

SUMMARY OF THE INVENTION

An aspect of the present invention is to provide a semiconductor memory device.

According to one embodiment of the present invention, the semiconductor memory device comprises a plurality of memory cells, a bit line sense amplifier, a local sense amplifier, and a sense amplifier. The memory cells are connected between a word line and a bit line pair, and the bit line sense amplifier is configured to amplify voltages of data from the bit line pair and transmit the data to a local data line pair. The local sense amplifier is configured to amplify voltages of the data from the local data line pair and transmit the data to a global data line pair in response to first and second control signals, and the sense amplifier is configured to amplify the voltages of the data from the global data line pair and transmit the data to an input/output line pair during a read operation. The local sense amplifier comprises a first read circuit, a second read circuit, and a write circuit, and when the memory device performs the read operation, the data is transmitted from the first read circuit to the write circuit via the second read circuit.

Another aspect of the present invention is to provide a local sense amplifier disposed between a local data line pair and a global data line pair in a semiconductor memory device.

According to one embodiment of the present invention, the local sense amplifier comprises first and second read circuits and a write circuit. The second read circuit is connected to the first read circuit, and the write circuit is connected to the second read circuit. When the memory device performs a read operation, the data is transmitted from the first read circuit to the write circuit via the second read circuit.

BRIEF DESCRIPTION OF THE DRAWINGS

The invention will be described according to the appended drawings in which.

DETAILED DESCRIPTION OF THE INVENTION

Figure 1:
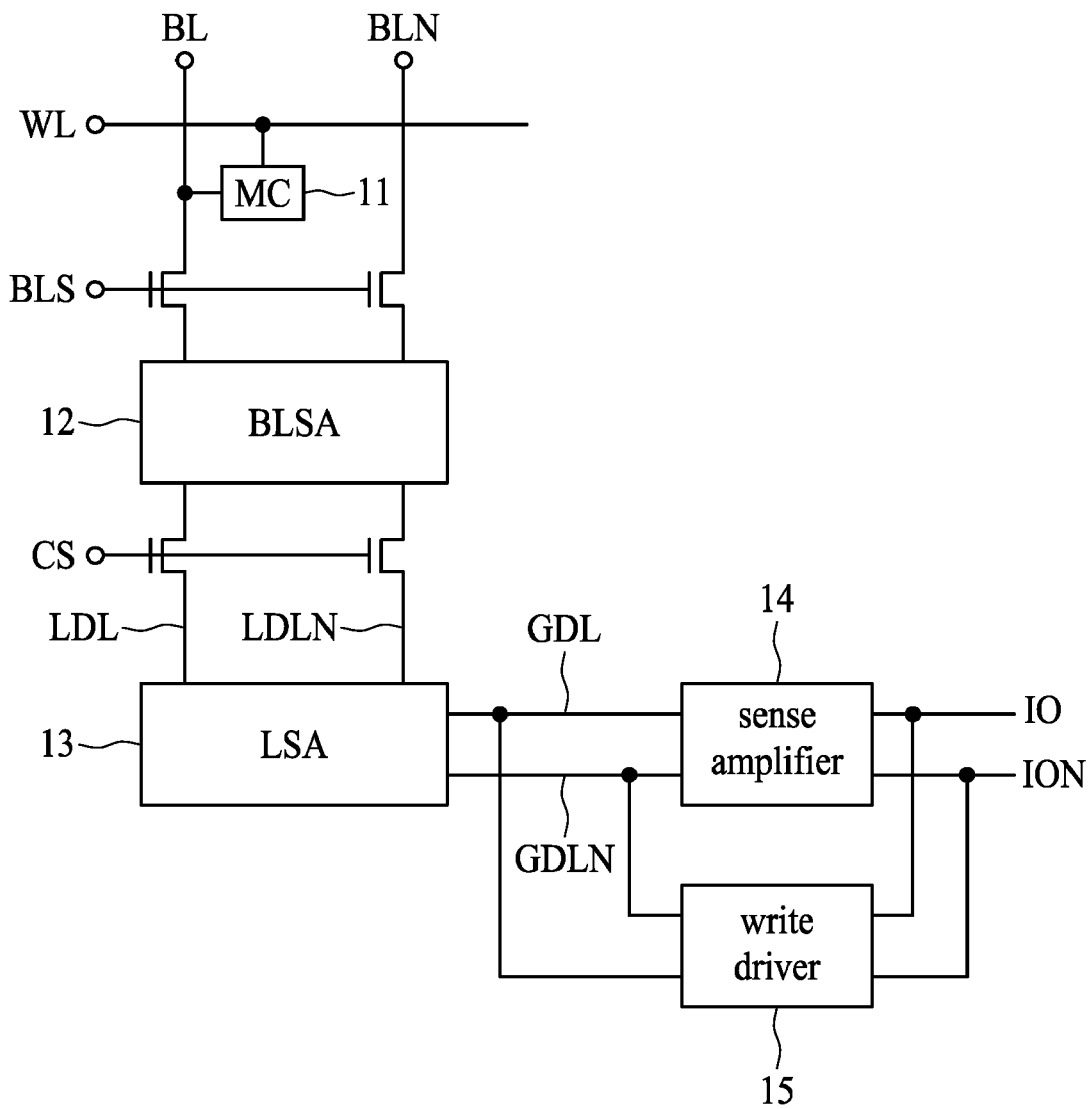
FIG. 1 is a circuit diagram of a semiconductor memory device according to one embodiment of the present invention.

FIG. 1 is a circuit diagram of a semiconductor memory device 10 according to one embodiment of the present invention. The memory device 10 comprises a plurality of memory cells MC 11 in a memory cell array block, a bit line sense amplifier BLSA 12, a local sense amplifier LSA 13, a sense amplifier 14, and a write driver 15. The memory cell MC 11 is connected between a word line WL and a bit line pair BL and BLN for performing a write or read operation. Two NMOS transistors controlled by a bit line selection signal BLS are disposed between the bit line pair BL and BLN and the amplifier BLSA 12. The amplifier BLSA 12 is configured to amplify voltages of data from the bit line pair BL and BLN. Two NMOS transistors controlled by a column selection signal CS are disposed between the outputs of the amplifier BLSA 12 and a local data line pair LDL and LDLN. A local sense amplifier LSA 13 is configured to amplify voltages of the data from the local data line pair LDL and LDLN and transmit the data to a global data line pair GDL and GDLN.

Referring to FIG. 1, the sense amplifier 14 is configured to amplify the voltages of data from the global data line pair GDL and GDLN and transmit the data to an input/output line pair IO and ION during a read operation. A write driver 15 is configured to drive the voltages of data from the input/output line pair IO and ION and transmit the data to the global data line pair GDL and GDLN during a write operation.

Figure 2:
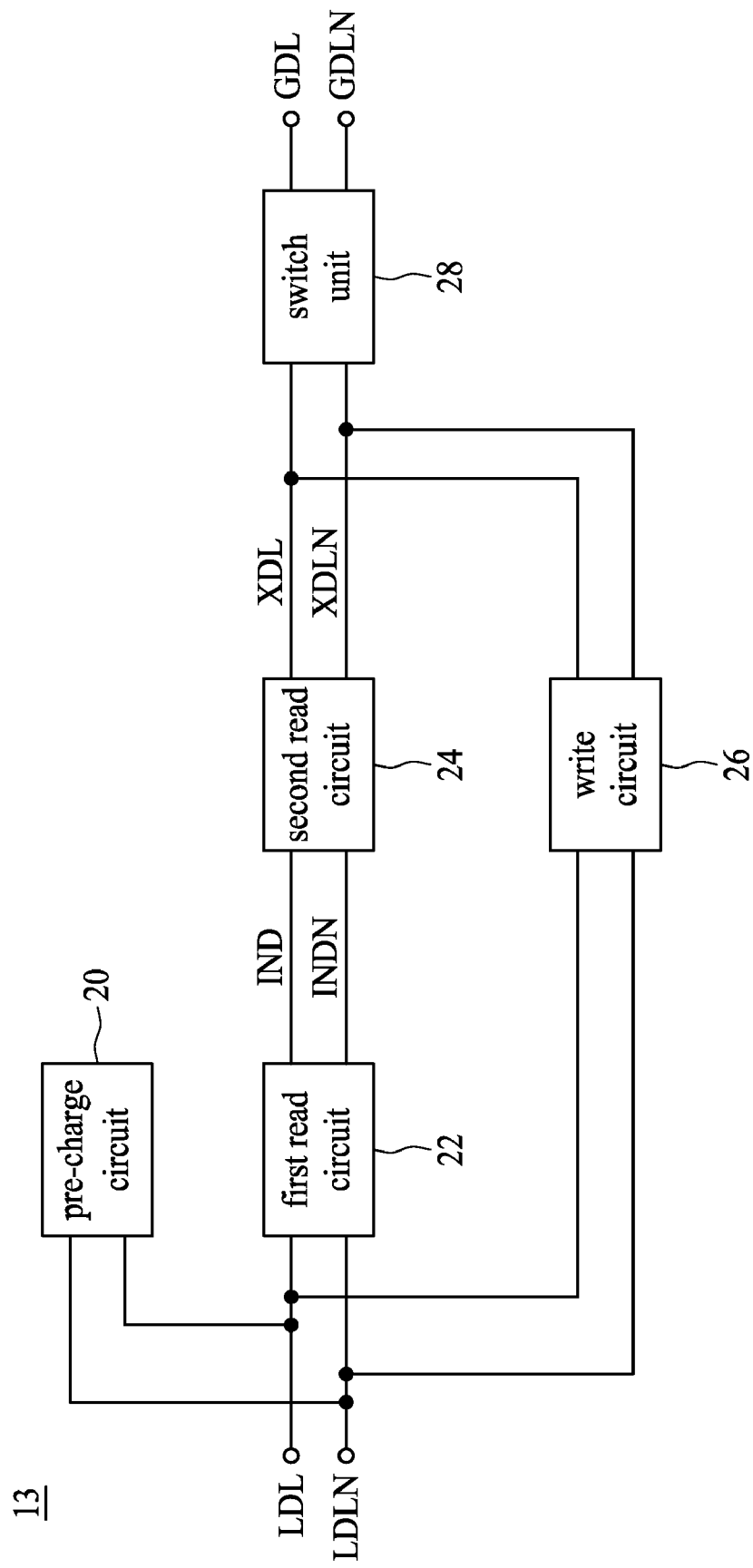
FIG. 2 shows a block diagram of the local sense amplifier LSA according to one embodiment of the present invention.

FIG. 2 shows a block diagram of the local sense amplifier LSA 13 according to one embodiment of the present invention, wherein the amplifier LSA 13 includes a two-stage amplifying circuit. The amplifier LSA 13 is used to improve the driving ability of the data transmitted in a data transmission path. Referring to FIG. 2, the amplifier LSA 13 comprises a pre-charge circuit 20, a first read circuit 22, a second read circuit 24, a switch unit 28, and a write circuit 26. The following descriptions of FIGS. 3 to 7 provide the details of the above-mentioned circuits of the present invention.

Figure 3:
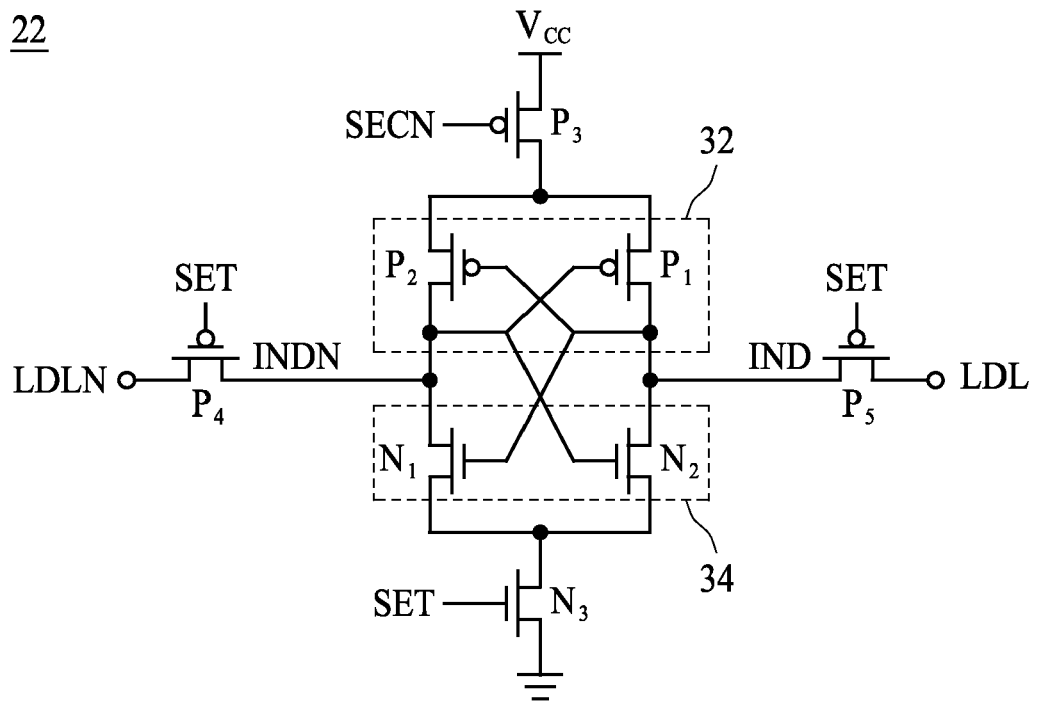
FIG. 3 shows a block diagram of the first read circuit according to one embodiment of the present invention.

FIG. 3 shows a block diagram of the first read circuit 22 according to one embodiment of the present invention. The first read circuit 22 is configured to amplify voltages of the data from the local data line pair LDL and LDLN and transmit the data to the second read circuit 24 in response to control signals SET and SEC, wherein signal SECN is the inverted signal of the control signal SEC.

Referring to FIG. 3, the first read circuit 22 comprises a differential input pair including PMOS transistors $P_4$ and $P_5$, first and second latch units 32 and 34, an NMOS transistor $N_3$, and a PMOS transistor $P_3$. The differential input pair is configured to receive voltages of the data from the local data line pair LDL and LDLN in response to the control signal SET, and the first and second latch units 32 and 34 are connected to the differential input pair. When the control signal SECN has a logic low level GND and the control signal SET has a logic high level $V_{CC}$, the NMOS transistor $N_3$ and the PMOS transistor $P_3$ turn on, and thus the first and second latch units 32 and 34 are enabled. As a result, the first read circuit 22 outputs signals IND and INDN in response to the input signals LDL and LDLN.

Figure 4:
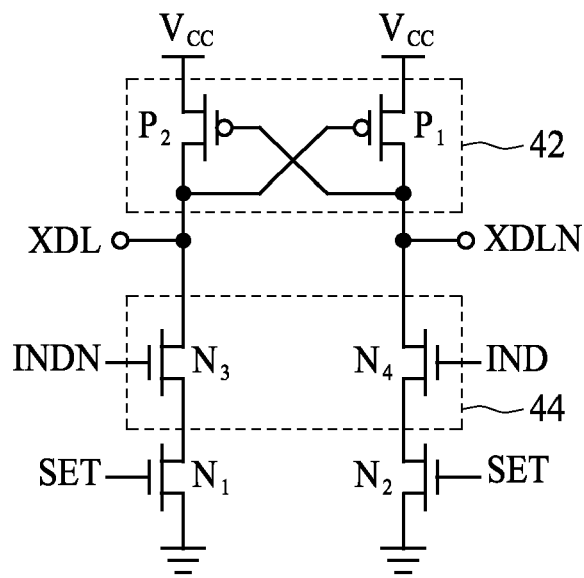
FIG. 4 shows a block diagram of the second read circuit according to one embodiment of the present invention.

FIG. 4 shows a block diagram of the second read circuit 24 according to one embodiment of the present invention. The second read circuit 24 is configured to receive the output signals of the first read circuit 22 and transmit the data to the switch unit 28 and to the write circuit 26 in response to the control signal SET.

Referring to FIG. 4, the second read circuit 24 comprises a differential input pair 44 including NMOS transistors $N_3$ and $N_4$, a latch unit 42, and NMOS transistors $N_1$ and $N_2$. The differential input pair 44 is configured to receive the output signals IND and INDN of the first read circuit 22, and the latch unit 42 is connected to the differential input pair 44. The NMOS transistors $N_1$ and $N_2$ are configured to enable the latch unit 42 in response to the control signal SET.

Figure 5:
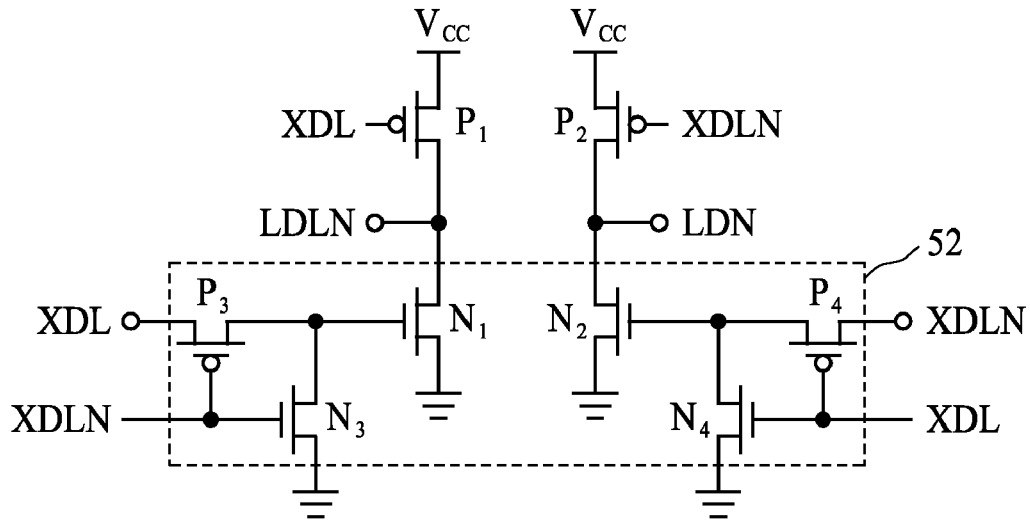
FIG. 5 shows a block diagram of the write circuit according to one embodiment of the present invention.

FIG. 5 shows a block diagram of the write circuit 26 according to one embodiment of the present invention. The write circuit 26 is configured to receive either complementary output signals XDL and XDLN of the second read circuit 24, or the voltages of the data from the global data line pair GDL and GDLN via the switch unit 28, and then transmit the data to the local data line pair LDL and LDLN.

Referring to FIG. 5, the write circuit 26 comprises a differential input pair 52 including PMOS transistors $P_3$ and $P_4$ and NMOS transistors $N_1$, $N_2$, $N_3$, and $N_4$. The differential input pair 52 is configured to receive either the complementary output signals XDL and XDLN of the second read circuit 24, or the voltages of the data from the global data line pair GDL and GDLN via the switch unit 28. The write circuit 26 further comprises PMOS transistors $P_1$ and $P_2$ connected to the differential input pair 52.

Figure 6:
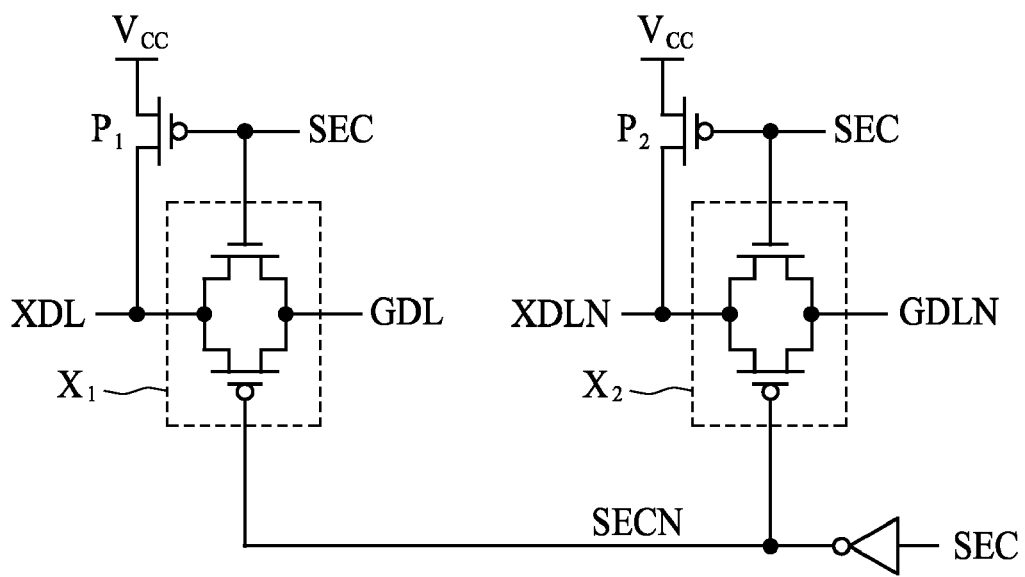
FIG. 6 shows a block diagram of the switch unit according to one embodiment of the present invention.

FIG. 6 shows a block diagram of the switch unit 28 according to one embodiment of the present invention. The switch unit 28 comprises CMOS transmission gates $X_1$ and $X_2$ and PMOS transistors $P_1$ and $P_2$. The CMOS transmission gates $X_1$ and $X_2$ are configured to receive either the complementary output signals XDL and XDLN of the second read circuit 24, or the voltages of the data from the global data line pair GDL and GDLN in response to the control signal SEC. The PMOS transistor $P_1$ has a gate connected to the control signal SEC, a source connected to a supply voltage $V_{CC}$, and a drain connected to the CMOS transmission gate $X_1$. The PMOS transistor $P_2$ has a gate connected to the control signal SEC, a source connected to the supply voltage $V_{CC}$, and a drain connected to the CMOS transmission gate $X_2$.

Figure 7:
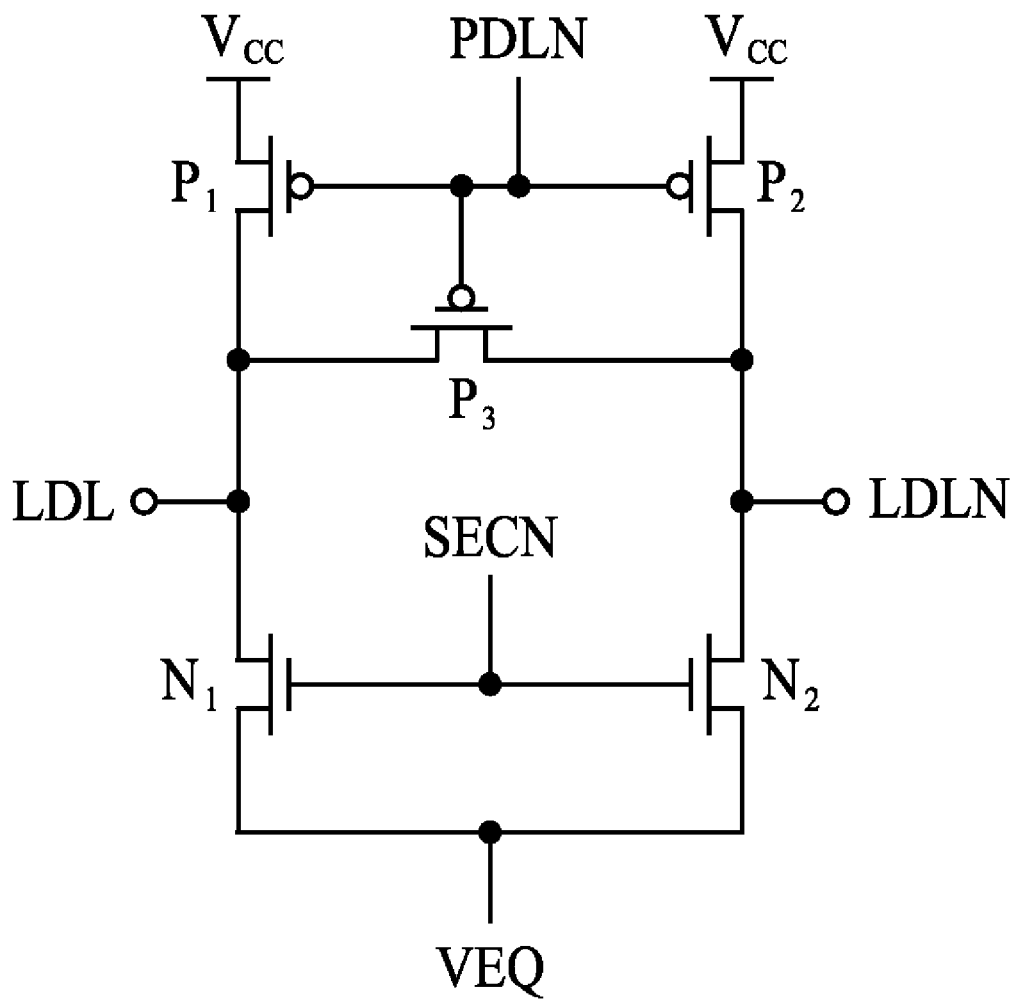
FIG. 7 shows a block diagram of the pre-charge circuit according to one embodiment of the present invention.

FIG. 7 shows a block diagram of the pre-charge circuit 20 according to one embodiment of the present invention. The pre-charge circuit 20 is configured to pre-charge the local data line pair LDL and LDLN to a predetermined value, such as the power supply $V_{CC}$, in response to a pre-charge signal PDLN. The pre-charge signal 20 is activated before the control signal SET arrives.

Referring to FIG. 7, the pre-charge circuit 20 comprises PMOS transistors $P_1$, $P_2$, and $P_3$ and NMOS transistors $N_1$ and $N_2$. The PMOS transistor $P_1$ has a gate for receiving the pre-charge control signal PDLN, a source connected to the supply voltage $V_{CC}$, and a drain connected to a drain of the NMOS transistor $N_1$. The PMOS transistor $P_2$ has a gate for receiving the pre-charge control signal PDLN, a source connected to the supply voltage $V_{CC}$, and a drain connected to a drain of the NMOS transistor $N_2$. The PMOS transistor $P_3$ has a gate for receiving the pre-charge control signal PDLN, a source connected to the drain of the NMOS transistor $N_1$, and a drain connected to the drain of the NMOS transistor $N_2$. The NMOS transistor $N_1$ has a gate for receiving the control signal SECN, a source connected to a reference voltage VEQ, and a drain connected to the drain of the PMOS transistor $P_1$. The NMOS transistor $N_2$ has a gate for receiving the control signal SECN, a source connected to the reference voltage VEQ, and a drain connected to the drain of the PMOS transistor $P_2$.

Operation of the semiconductor memory device according to an embodiment of the present invention is explained below with reference to FIGS. 1-6. When the memory device 10 performs a read operation, the data stored in the memory cells MC 11 is transmitted from the first read circuit 22 to the write circuit 26 via the second read circuit 24. To perform the read operation, the control signal SET is activated and has a logic high level $V_{CC}$. If the control signal SEC is also activated and has a logic high level $V_{CC}$, it represents that the present local data line pair LDL and LDLN is selected. Therefore, the switch unit 28 corresponding to the selected local data line pair LDL and LDLN is enabled. In this case, the first read circuit 22 receives the data of the local data line pair LDL and LDLN and generates the output signals IND and INDN to the second read circuit 24. Next, the second read circuit 24 generates output signals XDL and XDLN to the write circuit 26 and the write circuit 26 generates output signals LDL and LDLN again to suppress a signal coupling effect between the bit line pair BL and BLN. Meanwhile, the output signals XDL and XDLN are transmitted to the global data line pair GDL and GDLN via the switch unit 28, and thus the sense amplifier 14 outputs the data to the input/output line pair IO and ION to complete the read operation.

When the memory device 10 performs a write operation, the data from the input/output line pair IO and ION is first prepared to write into the memory cells MC 11, and thus the data is applied to the write circuit 26 first, and then transmitted to the first read circuit 22 and the second read circuit 24. To perform the write operation, the control signal SET is activated and has a logic high level $V_{CC}$. If the control signal SEC is also activated and has a logic high level $V_{CC}$, it represents that the present local data line pair LDL and LDLN is selected. Therefore, the switch unit 28 corresponding to the selected local data line pair LDL and LDLN is enabled, so that the write circuit 26 receives the data via the switch unit 28 and generates output signals to the local data line pair LDL and LDLN. Next, the first read circuit 22 receives the output signals from the write circuit 26 and generates output signals IND and INDN to the second read circuit 24. The second read circuit 24 generates output signals XDL and XDLN again to confirm the data transmission. Meanwhile, the output signals of the write circuit 26 are transmitted to the bit line pair BL and BLN via the amplifier BLSA 12 to perform the write operation.

The above-described embodiments of the present invention are intended to be illustrative only. Numerous alternative embodiments may be devised by those skilled in the art without departing from the scope of the following claims.

What is claimed is:

1. A semiconductor memory device, comprising:
   a plurality of memory cells connected between a word line and a bit line pair;
   a bit line sense amplifier configured to amplify voltages of data from the bit line pair and then transmitting the data to a local data line pair;
   a local sense amplifier configured to amplify voltages of the data from the local data line pair and then transmitting the data to a global data line pair in response to a first and a second control signals; and
   a sense amplifier configured to amplify the voltages of the data from the global data line pair and then transmitting the data to an input/output line pair during a read operation;
   wherein the local sense amplifier comprises a first read circuit, a second read circuit, and a write circuit, and when the memory device performs the read operation, the data is transmitted from the first read circuit to the write circuit via the second read circuit.

2. The semiconductor memory device of claim 1, wherein the first read circuit comprises:
   a differential input pair configured to receive the voltages of the data from the local data line pair in response to the first control signal;
   first and second latch units connected to the differential input pair;
   a first NMOS transistor configured to enable the first and second latch units in response to the first control signal; and
   a first PMOS transistor configured to enable the first and second latch units in response to the second control signal.

3. The semiconductor memory device of claim 1, wherein the write circuit comprises:
   a differential input pair configured to receive complementary output signals of the second read circuit; and
   first and second PMOS transistors connected to the differential input pair.

4. The semiconductor memory device of claim 1, further comprising a switch unit connected between the second read circuit and the global data line pair, wherein the switch unit comprises:
   first and second CMOS transmission gates connected between the second read circuit and the global data line pair;
   a first PMOS transistor having a gate connected to the second control signal, a source connected to a supply voltage, and a drain connected to the first CMOS transmission gate; and
   a second PMOS transistor having a gate connected to the second control signal, a source connected to the supply voltage, and a drain connected to the second CMOS transmission gate.

5. The semiconductor memory device of claim 1, further comprising a write driver configured to drive the voltages of data from the input/output line pair and then transmitting the data to the global data line pair during a write operation.

6. The semiconductor memory device of claim 1, wherein when the memory device performs the write operation, the data is transmitted from the write circuit to the second read circuit via the first read circuit.

7. The semiconductor memory device of claim 6, wherein the write circuit comprises:
   a differential input pair configured to receive the voltages of the data from the global data line pair; and
   first and second PMOS transistors connected to the differential input pair.

8. The semiconductor memory device of claim 6, wherein the first read circuit comprises:
   a differential input pair configured to receive the output signals of the write circuit in response to the first control signal;
   first and second latch units connected to the differential input pair;
   a first NMOS transistor configured to enable the first and second latch units in response to the first control signal; and
   a first PMOS transistor configured to enable the first and second latch units in response to the second control signal.

9. The semiconductor memory device of claim 1, wherein the second read circuit comprises:
   a differential input pair configured to receive the output signals of the first read circuit;
   a latch unit connected to the differential input pair; and
   first and second NMOS transistors configured to enable the latch unit in response to the first control signal.

10. The semiconductor memory device of claim 1, further comprising a pre-charge circuit connected to the local data line pair, wherein the pre-charge circuit comprises:
    a first PMOS transistor having a gate for receiving a pre-charge control signal, a source connected to the supply voltage, and a drain connected to a drain of a first NMOS transistor;
    a second PMOS transistor having a gate for receiving the pre-charge control signal, a source connected to the supply voltage, and a drain connected to a drain of a second NMOS transistor; and
    a third PMOS transistor having a gate for receiving the pre-charge control signal, a source connected to the drain of the first NMOS transistor, and a drain connected to the drain of the second NMOS transistor;

wherein the first NMOS transistor has a gate for receiving an inverted second control signal, a source connected to a reference voltage, and a drain connected to the drain of the first PMOS transistor; and the second NMOS transistor has a gate for receiving the inverted second control signal, a source connected to the reference voltage, and a drain connected to the drain of the second PMOS transistor.

11. A local sense amplifier disposed between a local data line pair and a global data line pair in a semiconductor memory device, comprising:
   a first read circuit;
   a second read circuit connected to the first read circuit; and
   a write circuit connected to the second read circuit;
   wherein when the memory device performs a read operation, the data is transmitted from the first read circuit to the write circuit via the second read circuit.

12. The local sense amplifier of claim 11, wherein the first read circuit comprises:
   a differential input pair configured to receive voltages of the data from the local data line pair in response to a first control signal;
   first and second latch units connected to the differential input pair;
   a first NMOS transistor configured to enable the first and second latch units in response to the first control signal; and
   a first PMOS transistor configured to enable the first and second latch units in response to a second control signal.

13. The local sense amplifier of claim 11, wherein the write circuit comprises:
   a differential input pair configured to receive complementary output signals of the second read circuit; and
   first and second PMOS transistors connected to the differential input pair.

14. The local sense amplifier of claim 11, further comprising a switch unit connected between the second read circuit and the global data line pair, wherein the switch unit comprises:
   first and second CMOS transmission gates connected between the second read circuit and the global data line pair;
   a first PMOS transistor having a gate connected to the second control signal, a source connected to a supply voltage, and a drain connected to the first CMOS transmission gate; and
   a second PMOS transistor having a gate connected to the second control signal, a source connected to the supply voltage, and a drain connected to the second CMOS transmission gate.

15. The local sense amplifier of claim 11, wherein when the memory device performs a write operation, the data is transmitted from the write circuit to the second read circuit via the first read circuit.

16. The local sense amplifier of claim 15, wherein the write circuit comprises:
   a differential input pair configured to receive the voltages of the data from the global data line pair; and
   first and second PMOS transistors connected to the differential input pair.

17. The local sense amplifier of claim 15, wherein the first read circuit comprises:
   a differential input pair configured to receive the output signals of the write circuit in response to the first control signal;
   first and second latch units connected to the differential input pair;
   a first NMOS transistor configured to enable the first and second latch units in response to the first control signal; and
   a first PMOS transistor configured to enable the first and second latch units in response to the second control signal.

18. The local sense amplifier of claim 11, wherein the second read circuit comprises:
   a differential input pair configured to receive the output signals of the first read circuit;
   a latch unit connected to the differential input pair; and
   first and second NMOS transistors configured to enable the latch unit in response to the first control signal.

19. The local sense amplifier of claim 11, further comprising a pre-charge circuit connected to the local data line pair, wherein the pre-charge circuit comprises:
   a first PMOS transistor having a gate for receiving a pre-charge control signal, a source connected to the supply voltage, and a drain connected to a drain of a first NMOS transistor;
   a second PMOS transistor having a gate for receiving the pre-charge control signal, a source connected to the supply voltage, and a drain connected to a drain of a second NMOS transistor; and
   a third PMOS transistor having a gate for receiving the pre-charge control signal, a source connected to the drain of the first NMOS transistor, and a drain connected to the drain of the second NMOS transistor;
   wherein the first NMOS transistor has a gate for receiving an inverted second control signal, a source connected to a reference voltage, and a drain connected to the drain of the first PMOS transistor; and the second NMOS transistor has a gate for receiving the inverted second control signal, a source connected to the reference voltage, and a drain connected to the drain of the second PMOS transistor.

* * * * *